United States Patent
Iwamoto

(10) Patent No.: US 9,374,062 B2
(45) Date of Patent: Jun. 21, 2016

(54) ELASTIC WAVE FILTER DEVICE AND MANUFACTURING METHOD OF THE SAME

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/483,194

(22) Filed: Sep. 11, 2014

(65) Prior Publication Data

US 2015/0028966 A1 Jan. 29, 2015

Related U.S. Application Data

(63) Continuation of application No. PCT/JP2013/057569, filed on Mar. 16, 2013.

(30) Foreign Application Priority Data

Mar. 23, 2012 (JP) ................................ 2012-067146

(51) Int. Cl.
*H03H 9/72* (2006.01)
*H03H 3/08* (2006.01)
(Continued)

(52) U.S. Cl.
CPC .............. *H03H 9/725* (2013.01); *H03H 3/08* (2013.01); *H03H 9/02834* (2013.01); *H03H 9/02984* (2013.01); *H01J 37/3171* (2013.01); *H03H 9/02543* (2013.01); *H03H 9/02574* (2013.01);
(Continued)

(58) Field of Classification Search
CPC ... H01J 37/3171; H03H 3/08; H03H 9/02543; H03H 9/02574; H03H 9/02614; H03H 9/02834; H03H 9/02984; H03H 9/1085; H03H 9/725
USPC .......................... 333/133, 193–196; 310/346
See application file for complete search history.

(56) References Cited

U.S. PATENT DOCUMENTS

| 7,213,322 B2 * | 5/2007 | Nakagawara ............ H03H 3/08 204/192.32 |
| --- | --- | --- |
| 2002/0000895 A1 | 1/2002 | Takahashi et al. |

(Continued)

FOREIGN PATENT DOCUMENTS

| JP | 11-26623 A | 1/1999 |
| --- | --- | --- |
| JP | 2003-17967 A | 1/2003 |

(Continued)

OTHER PUBLICATIONS

Official Communication issued in International Patent Application No. PCT/JP2013/057569, mailed on Jun. 11, 2013.

*Primary Examiner* — Benny Lee
*Assistant Examiner* — Jorge Salazar, Jr.
(74) *Attorney, Agent, or Firm* — Keating & Bennett, LLP

(57) ABSTRACT

An elastic wave filter device includes a transmission elastic wave filter chip and a reception elastic wave filter chip. The transmission elastic wave filter chip includes an insulating support substrate, a piezoelectric layer directly or indirectly supported by the support substrate, and an IDT electrode in contact with the piezoelectric layer. The reception elastic wave filter chip includes a piezoelectric substrate and an IDT electrode provided on the piezoelectric substrate. The thermal conductivity of the support substrate is higher than the thermal conductivity of either of the piezoelectric layer and the piezoelectric substrate.

13 Claims, 5 Drawing Sheets

(51) Int. Cl.
*H03H 9/02* (2006.01)
*H03H 9/10* (2006.01)
*H01J 37/317* (2006.01)

(52) U.S. Cl.
CPC .......... *H03H 9/02614* (2013.01); *H03H 9/1085* (2013.01)

(56) References Cited

U.S. PATENT DOCUMENTS

| | | |
|---|---|---|
| 2003/0067369 A1 | 4/2003 | Nakano et al. |
| 2010/0088868 A1 | 4/2010 | Kando et al. |
| 2010/0108248 A1 | 5/2010 | Hayakawa et al. |
| 2010/0109802 A1 | 5/2010 | Tanaka |
| 2010/0289600 A1 | 11/2010 | Takada et al. |
| 2011/0041987 A1 | 2/2011 | Hori et al. |
| 2011/0241480 A1 | 10/2011 | Nakano et al. |
| 2015/0007424 A1 | 1/2015 | Iwamoto |

FOREIGN PATENT DOCUMENTS

| | | |
|---|---|---|
| JP | 2003-101372 A | 4/2003 |
| JP | 2010-109694 A | 5/2010 |
| JP | 2010-109909 A | 5/2010 |
| JP | 2011-71967 | 4/2011 |
| JP | 2011-211460 A | 10/2011 |
| JP | 2012-5106 | 1/2012 |
| WO | 2009/081651 A1 | 7/2009 |
| WO | 2009/104438 A1 | 8/2009 |

* cited by examiner

ELASTIC WAVE FILTER DEVICE AND MANUFACTURING METHOD OF THE SAME

BACKGROUND OF THE INVENTION

1. Field of the Invention

The present invention relates to elastic wave filter devices and manufacturing methods of elastic wave filter devices.

2. Description of the Related Art

Recently, as disclosed in Japanese Unexamined Patent Application Publication No. 11-26623, for example, elastic wave filter devices in which a transmission elastic wave filter chip and a reception elastic wave filter chip are facedown mounted on a printed-circuit board using a flip-chip mounting technique have been known. In an elastic wave filter device disclosed in Japanese Unexamined Patent Application Publication No. 11-26623, a transmission elastic wave filter chip and a reception elastic wave filter chip are encapsulated by a resin encapsulation member provided on a printed-circuit board.

An elastic wave filter chip generates heat during operation. This raises a risk that a temperature changes in an elastic wave filter device during operation so that characteristics of the elastic wave filter device provided with an encapsulation member are changed. To eliminate this risk, there is a demand for the improvement in heat dissipation properties of elastic wave filter devices.

SUMMARY OF THE INVENTION

Preferred embodiments of the present invention provide an elastic wave filter device and a method capable of manufacturing an elastic wave filter device having an improved heat dissipation property.

An elastic wave filter device according to a preferred embodiment of the present invention includes a transmission elastic wave filter chip and a reception elastic wave filter chip. The transmission elastic wave filter chip includes a support substrate, a piezoelectric layer, and an interdigital transducer (IDT) electrode. The support substrate is made of an insulating material. The piezoelectric layer is directly or indirectly supported by the support substrate. The IDT electrode is so provided as to make contact with the piezoelectric layer. The reception elastic wave filter chip includes a piezoelectric substrate and an IDT electrode provided on the piezoelectric substrate. Thermal conductivity of the support substrate is higher than the thermal conductivity of either of the piezoelectric layer and the piezoelectric substrate.

According to a specific aspect of the elastic wave filter device according to a preferred embodiment of the present invention, the elastic wave filter device further includes a mounting substrate and an insulation member. The transmission elastic wave filter chip and the reception elastic wave filter chip are facedown mounted on the mounting substrate. The insulation member is disposed on the mounting substrate. The insulation member covers the transmission elastic wave filter chip and the reception elastic wave filter chip.

According to another specific aspect of the elastic wave filter device according to a preferred embodiment of the present invention, a thermal expansion coefficient of the support substrate is smaller than that of the piezoelectric layer.

According to another specific aspect of the elastic wave filter device according to a preferred embodiment of the present invention, the support substrate is made of at least one type of material selected from a group of aluminum oxide, aluminum nitride, boron nitride, silicon carbide, silicon, and magnesium oxide.

According to still another specific aspect of the elastic wave filter device according to a preferred embodiment of the present invention, the insulation member includes a protection unit and an insulation plate. The protection unit is provided on the mounting substrate. The protection unit covers side surfaces of the support substrate and the piezoelectric layer as well as side surfaces of the piezoelectric substrate. The protection unit is arranged to expose at least a portion of a surface of the support substrate on the opposite side to the mounting substrate and at least a portion of a surface of the piezoelectric substrate on the opposite side to the mounting substrate. The insulation plate extends across the surface of the support substrate exposed from the protection unit and the surface of the piezoelectric substrate exposed from the protection unit. The insulation plate has a higher thermal conductivity than the piezoelectric substrate and the piezoelectric layer.

According to still another specific aspect of the elastic wave filter device according to a preferred embodiment of the present invention, the insulation plate is made of at least one type of material selected from a group of aluminum oxide, aluminum nitride, boron nitride, silicon carbide, magnesium oxide, and silicon.

According to still another specific aspect of the elastic wave filter device according to a preferred embodiment of the present invention, the IDT electrode includes an epitaxial film whose major component is aluminum.

According to still another specific aspect of the elastic wave filter device according to a preferred embodiment of the present invention, the transmission elastic wave filter chip is a ladder-type elastic wave filter chip, while the reception elastic wave filter chip is a longitudinally coupled resonator-type elastic wave filter chip.

A manufacturing method of an elastic wave filter device according to yet another preferred embodiment of the present invention is a method for manufacturing the elastic wave filter device according to other preferred embodiments of the present invention. In the manufacturing method of the elastic wave filter device according to a preferred embodiment of the present invention, ions are implanted from one surface of the piezoelectric substrate which is thicker than the piezoelectric layer. A temporary support member is laminated on the one surface of the piezoelectric substrate from which the ions have been implanted. While heating the piezoelectric substrate on which the temporary support member is laminated, the piezoelectric substrate is cut at a highly-concentrated ion implantation region of the piezoelectric substrate where the concentration of the implanted ions is at its maximum so as to form the piezoelectric layer on the temporary support member. The support substrate is directly or indirectly laminated on a surface of the piezoelectric layer on the opposite side to the temporary support member. The temporary support member is isolated from the piezoelectric layer that is directly or indirectly laminated on the support substrate.

According to a specific aspect of the manufacturing method of the elastic wave filter device according to a preferred embodiment of the present invention, a dielectric layer whose thermal conductivity is higher than that of the piezoelectric layer is formed on the piezoelectric layer, and the support substrate is laminated on the dielectric layer.

According to various preferred embodiments of the present invention, it is possible to provide an elastic wave filter device with an improved heat dissipation property and a method of manufacturing such an elastic wave filter device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
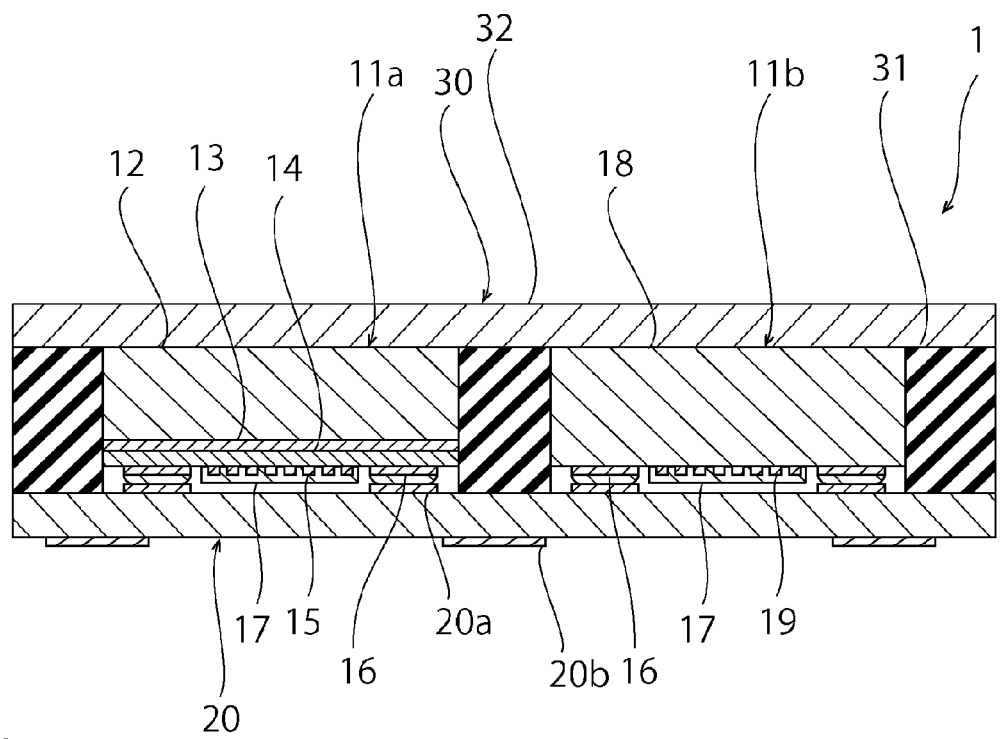
FIG. 1 is a schematic cross-sectional view illustrating a surface acoustic wave filter device according to a preferred embodiment of the present invention.

Examples of preferred embodiments of the present invention will be described hereinafter. Note, however, that the following preferred embodiments are merely examples. The present invention is not intended to be limited to the following preferred embodiments in any way.

Furthermore, in the drawings referred to in the preferred embodiments and the like, members having functions that are identical or substantially identical are given identical reference signs. The drawings referred to in the preferred embodiments and the like are schematic depictions, and as such the ratios of dimensions and so on of objects depicted in the drawings may differ from the actual ratios of dimensions and so on of those objects. The ratios of dimensions and so on of the objects may differ from drawing to drawing as well. The specific ratios of dimensions and so on of objects should be understood from the following descriptions.

FIG. 1 is a schematic cross-sectional view illustrating a surface acoustic wave filter device 1 according to a preferred embodiment of the present invention.

As shown in FIG. 1, the surface acoustic wave filter device 1 includes a mounting substrate 20. The mounting substrate 20 preferably is configured with insulating ceramics such as alumina or the like, an appropriate insulating material such as resin or the like, or a semiconductor material. A plurality of electrode lands 20a are disposed on one main surface of the mounting substrate 20. On the other main surface of the mounting substrate 20, a plurality of electrode lands 20b are disposed. The electrode lands 20a and the electrode lands 20b are electrically connected with each other through via holes, wiring electrodes, and the like (not shown) that are provided inside the mounting substrate 20.

A transmission surface acoustic wave filter chip 11a and a reception surface acoustic wave filter chip 11b are facedown mounted on the mounting substrate 20 using a flip-chip mounting technique.

The transmission surface acoustic wave filter chip 11a includes a support substrate 12. The support substrate 12 is made of an insulating material. It is preferable for the support substrate 12 to be made of at least one type of material selected from a group of aluminum oxide, aluminum nitride, boron nitride, silicon carbide, silicon, and magnesium oxide, for example. The support substrate 12 preferably is about 30 μm to about 250 μm in thickness, for example.

A dielectric layer 13 is provided on the support substrate 12. Providing the dielectric layer 13 makes it possible to improve the characteristics of the surface acoustic wave filter device 1. It is preferable for the dielectric layer 13 to have a higher thermal conductivity than a piezoelectric layer 14, which will be explained later, and more preferable to have thermal conductivity which is more than about twenty times as much as the thermal conductivity of the piezoelectric layer 14. In this case, heat generated in the piezoelectric layer 14 is efficiently discharged to the dielectric layer 13 side.

As a preferable material for the dielectric layer 13, aluminum nitride, silicon oxide, silicon nitride, silicon oxynitride, metallic oxide, metallic nitride, diamond-like carbon, or the like can be cited, for example. Among these, aluminum nitride is more preferably used as a material of the dielectric later 13. The dielectric layer 13 may be configured with the same material as that of the support substrate 12.

The piezoelectric layer 14 is provided on the dielectric later 13. The piezoelectric layer 14 is indirectly supported by the support substrate 12. The support substrate 12 may directly support the piezoelectric layer 14 without the dielectric layer 13 being provided.

The piezoelectric layer 14 preferably is configured with a piezoelectric single crystal such as $LiTaO_3$, $LiNbO_3$ or the like, piezoelectric ceramics such as PZT-based ceramics, or the like, for example. The thickness of the piezoelectric layer 14 is appropriately determined based on characteristics of the elastic wave device. To correspond to a frequency band used in mobile communications, it is preferable for the thickness of the piezoelectric layer 14 to be about 0.1 μm to about 1.2 μm, for example.

On the piezoelectric layer 14, there are provided an IDT electrode 15 and an electrode land 16 to which the IDT electrode 15 is electrically connected. The IDT electrode 15 is preferably arranged to make contact with the piezoelectric layer 14. Although the IDT electrode 15 and the electrode land 16 can be each configured with appropriate conductive materials, it is preferable to include an epitaxial film whose major component is aluminum. That is, each of the IDT electrode 15 and the electrode land 16 may be configured with only an epitaxial film whose major component is aluminum or configured with a multilayer body including an epitaxial film whose major component is aluminum and another conductive film. The epitaxial film whose major component is aluminum has a high stress migration resistance. Accordingly, by making each of the IDT electrode 15 and the electrode land 16 include the epitaxial film whose major component is aluminum, the surface acoustic wave filter device 1 having an excellent electric power handling capability is obtained.

The epitaxial film whose major component is aluminum preferably is produced in the following manner, for example. That is, a Ti film with thickness of approximately 100 nm is formed first on a piezoelectric substrate 18 at a temperature of about 100° C. to about 200° C., for example, thereafter a material whose major component is aluminum is formed by a thin film formation method such as, for example, an electron beam evaporation technique, a sputtering technique, a CVD (chemical vapor deposition) technique, or the like so as to obtain the epitaxial film whose major component is aluminum.

A protection film 17 is provided on the piezoelectric layer 14 so as to cover the IDT electrode 15. Providing the protection film 17 makes it possible to enhance moisture resistance because the IDT electrode 15 is preferably protected from moisture. The protection film 17 can be configured with an appropriate insulation material such as silicon oxide, silicon nitride, or the like, for example.

The transmission surface acoustic wave filter chip 11a is a ladder-type surface acoustic wave filter chip including a ladder-type surface acoustic wave filter unit that includes a resonator configured of the IDT electrode 15.

The reception surface acoustic wave filter chip 11b includes the piezoelectric substrate 18. The piezoelectric substrate 18 preferably is configured with, for example, $LiNbO_3$, $LiTaO_3$, crystal, or the like. It is preferable for the thickness of the piezoelectric layer 18 to be about 30 μm to about 250 μm, for example, and more preferable to be about 50 μm to about 150 μm.

An IDT electrode 19 and the electrode land 16 to which the IDT electrode 19 is electrically connected are disposed on the piezoelectric substrate 18. Although the IDT electrode 19 and the electrode land 16 can be each configured with appropriate conductive materials, it is preferable to include an epitaxial film whose major component is aluminum. That is, each of the IDT electrode 19 and the electrode land 16 may be configured with only an epitaxial film whose major component is aluminum or configured with a multilayer body formed of an epitaxial film whose major component is aluminum and another conductive film. The epitaxial film whose major component is aluminum has a high stress migration resistance. Accordingly, by making each of the IDT electrode 19 and the electrode land 16 include the epitaxial film whose major component is aluminum, the surface acoustic wave filter device 1 having an excellent electric power handling capability is obtained.

Note that a surface of the piezoelectric substrate 18 on the opposite side to the mounting substrate 20 is flush or substantially flush with a surface of the support substrate 12 on the opposite side to the mounting substrate 20.

The reception surface acoustic wave filter chip 11b is a longitudinally coupled resonator-type surface acoustic wave filter chip including a longitudinally coupled resonator-type surface acoustic wave filter unit that includes a resonator configured of the IDT electrode 19, has a balanced-unbalanced transforming function, and is capable of balance output.

An insulation member 30 is provided on the mounting substrate 20. With the insulation member 30, the transmission surface acoustic wave filter chip 11a and the reception surface acoustic wave filter chip 11b are encapsulated.

The insulation member 30 includes a protection unit 31 and an insulation plate 32. The protection unit 31 is provided on the mounting substrate 20. The protection unit 31 covers side surfaces of the support substrate 12, the dielectric layer 13, and the piezoelectric layer 14 as well as side surfaces of the piezoelectric substrate 18. The protection unit 31 is preferably arranged to expose at least a portion of the surface of the support substrate 12 on the opposite side to the mounting substrate 20 and at least a portion of the surface of the piezoelectric substrate 18 on the opposite side to the mounting substrate 20. In the present preferred embodiment, the protection unit 31 is preferably arranged to expose substantially the whole surface of the support substrate 12 on the opposite side to the mounting substrate 20 as well as substantially the whole surface of the piezoelectric substrate 18 on the opposite side to the mounting substrate 20.

The protection unit 31 preferably is configured with an appropriate resin material. The protection unit 31 may contain inorganic filler such as appropriate particles whose major component is aluminum oxide, aluminum nitride, boron nitride, silicon carbide, magnesium oxide, silicon, silicon oxide, carbon, cerium oxide, or the like.

Note that the protection unit 31 can be formed through molding, resin-film pressing, or the like.

The insulation plate 32 is preferably arranged to extend across the surface of the support substrate 12 exposed from the protection unit 31 and the surface of the piezoelectric substrate 18 exposed from the protection unit 31. Specifically, the insulation plate 32 is so provided as to substantially cover the whole upper surfaces of the transmission surface acoustic wave filter chip 11a and the reception surface acoustic wave filter chip 11b as well as the whole upper surface of the protection unit 31.

It is preferable for the insulation plate 32 to have a higher thermal conductivity than the piezoelectric substrate 18, the piezoelectric layer 14, and the dielectric layer 13. It is preferable for the thermal conductivity of the insulation plate 32 to be more than about five times as much as the thermal conductivity of the piezoelectric substrate 18 and the piezoelectric layer 14, and more preferable to be more than about twenty times, for example. Further, it is preferable for a coefficient of linear expansion of the insulation plate 32 to be smaller than the coefficient of linear expansion of the piezoelectric substrate 18 and the piezoelectric layer 14, more preferable to be less than about half the coefficient of linear expansion in the elastic wave propagation direction of the piezoelectric substrate 18 and the piezoelectric layer 14, and further preferable to be less than about one quarter thereof, for example.

The thermal conductivity of the piezoelectric substrate 18 and piezoelectric layer 14 configured with $LiTaO_3$ is approximately 3.6 W/(m/K). The thermal conductivity of the piezoelectric substrate 18 and piezoelectric layer 14 configured with $LiNbO_3$ is approximately 6.4 W/(m/K). Accordingly, it is preferable for the thermal conductivity of the insulation plate 32, when using the piezoelectric substrate 18 and piezoelectric layer 14 configured with $LiTaO_3$, to be larger than 3.6 W/(m/K), more preferable to be equal to larger than 18 W/(m/K), and further preferable to be equal to or larger than 72 W/(m/K). In the case of using the piezoelectric substrate 18 and piezoelectric layer 14 configured with $LiNbO_3$, it is preferable for the thermal conductivity of the insulation plate 32 to be larger than 6.4 W/(m/K), more preferable to be equal to or larger than 32 W/(m/K), and further preferable to be equal to or larger than 128 W/(m/K).

An insulation plate made of at least one type of material selected from a group of aluminum oxide, aluminum nitride, boron nitride, silicon carbide, magnesium oxide, and silicon (highly-resistive silicon) preferably is used as the insulation plate 32.

A heat generation property of the transmission surface acoustic wave filter chip 11a is different from that of the reception surface acoustic wave filter chip 11b. In general, the transmission surface acoustic wave filter chip 11a is more likely to generate heat than the reception surface acoustic wave filter chip 11b.

Here, in the surface acoustic wave filter device 1, the thermal conductivity of the support substrate 12 is higher than the thermal conductivity of either of the piezoelectric layer 14 and the piezoelectric substrate 18. With this, heat generated in a region where the piezoelectric layer 14 of the transmission surface acoustic wave filter chip 11a makes contact with the IDT electrode 15 is efficiently discharged through the support substrate 12. This makes it possible to prevent an increase in the temperature of the transmission surface acoustic wave filter chip 11a. Meanwhile, different from the transmission surface acoustic wave filter chip 11a, the reception surface acoustic wave filter chip 11b preferably is configured using the piezoelectric substrate 18 whose thermal conductivity is lower than that of the support substrate 12. Thus, the heat of the transmission surface acoustic wave filter chip 11a is unlikely to be transferred to a region where the piezoelectric substrate 18 makes contact with the IDT electrode 19. This makes it possible to prevent an increase in the temperature of the reception surface acoustic wave filter chip 11b due to the heat of the transmission surface acoustic wave filter chip 11a. Accordingly, the surface acoustic wave filter device 1 having an excellent heat dissipation property, stable characteristics, and an excellent electric power handling capability is realized.

From the standpoint of improvement in the heat dissipation property, stability of characteristics, and electric power handling capability of the surface acoustic wave filter device 1, it is preferable for the thermal conductivity of the support substrate 12 to be more than about five times as much as the thermal conductivity of the piezoelectric layer 14 and the piezoelectric substrate 18, and more preferable to be more than about twenty times, for example.

Further, it is preferable for the thermal conductivity of the dielectric layer 13 to be higher than that of the piezoelectric layer 14, that is, preferable to be more than about twice as much as the thermal conductivity of the piezoelectric layer 14, and more preferable to be more than about twenty times, for example.

Furthermore, in the surface acoustic wave filter device 1, the insulation plate 32 whose thermal conductivity is higher than that of the piezoelectric layer 14 and the piezoelectric substrate 18 is provided on the support substrate 12 and the piezoelectric substrate 18, which further improves the heat dissipation property through the insulation plate 32.

In the surface acoustic wave filter device 1, the thermal expansion coefficient of the support substrate 12 is lower than that of the piezoelectric layer 14. With this, it is possible to significantly reduce or prevent expansion/contraction of the piezoelectric layer 14 when the temperature of the surface acoustic wave filter device 1 is changed. In addition, the coefficient of linear expansion of the insulation plate 32 is lower than that of the piezoelectric substrate 18. This makes it possible to significantly reduce or prevent the expansion/contraction of the piezoelectric substrate 18 when the temperature of the surface acoustic wave filter device 1 is changed. Accordingly, the surface acoustic wave filter device 1 having excellent frequency-temperature characteristics is realized.

Next, a non-limiting example of a manufacturing method of the surface acoustic wave filter device 1 is described below. The manufacturing method of the surface acoustic wave filter device 1 is not intended to be limited to any specific one. However, by using the following manufacturing method that uses an ion implantation technique, the transmission surface acoustic wave filter chip 11a having the piezoelectric layer is obtained with ease.

First, the transmission surface acoustic wave filter chip 11a and the reception surface acoustic wave filter chip 11b are prepared. The transmission surface acoustic wave filter chip 11a can be manufactured in the following manner, for example.

Figure 2:
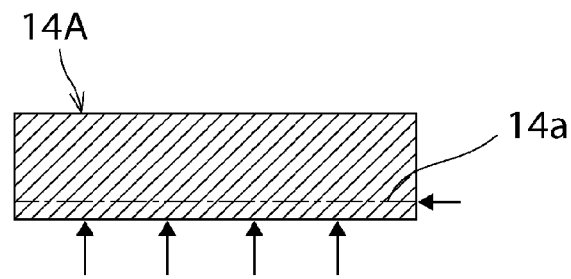
FIG. 2 is a schematic cross-sectional view for explaining a manufacturing process of a transmission surface acoustic wave filter chip according to a preferred embodiment of the present invention.

First, a piezoelectric substrate 14A as shown in FIG. 2 is prepared. The piezoelectric substrate 14A is thicker than the piezoelectric layer 14.

Next, hydrogen ions, helium ions, or the like are implanted from one surface of the piezoelectric substrate 14A as indicated by arrows in the drawing. Through this, ion concentration distribution is generated in the thickness direction inside the piezoelectric substrate 14A. The region where the ion concentration is at its maximum is indicated by a dot-dash line in FIG. 2.

Energy for the ion implantation can be appropriately determined depending on the thickness of the piezoelectric layer 14 to be finally obtained. The amount of energy in operation of the ion implantation is, for example, about $1.0 \times 10^{17}$ atoms/cm$^2$ at 150 keV.

Figure 3:
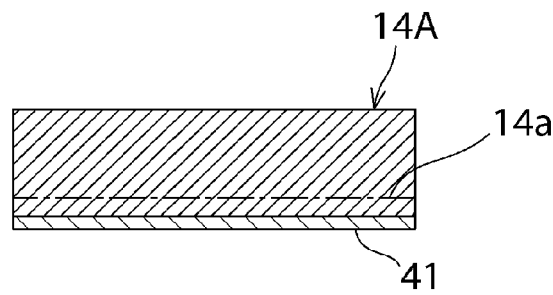
FIG. 3 is a schematic cross-sectional view for explaining a manufacturing process of a transmission surface acoustic wave filter chip according to a preferred embodiment of the present invention.

Next, as shown in FIG. 3, an etching layer 41 is formed on the surface of the piezoelectric substrate 14A from which the ions have been implanted. The etching layer 41 is a layer to be removed by etching in a post-process. The etching layer 41 can be configured with Cu or the like, for example. The etching layer 41 can be formed using a sputtering technique, a CVD (chemical vapor deposition) technique, or the like, for example.

Figure 4:
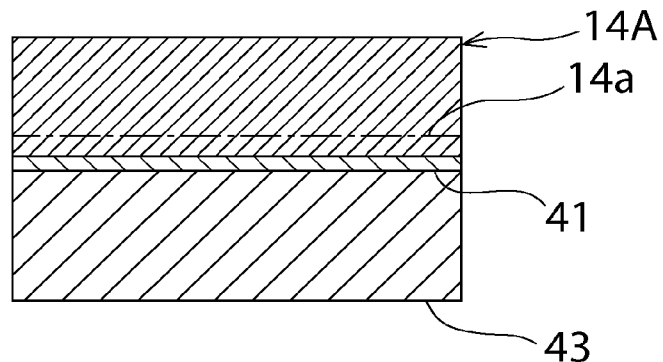
FIG. 4 is a schematic cross-sectional view for explaining a manufacturing process of a transmission surface acoustic wave filter chip according to a preferred embodiment of the present invention.

Next, as shown in FIG. 4, a temporary support member 43 is laminated and bonded on the etching layer 41. Since the temporary support member 43 is a member to be removed in the post-process, the material thereof is not intended to be limited to any specific one. The temporary support member 43 can be configured with, for example, a LiTaO$_3$ plate, an alumina plate, an insulating ceramic plate, or the like. Note that the temporary support member 43 may be directly bonded to the piezoelectric substrate 14A.

Figure 5:
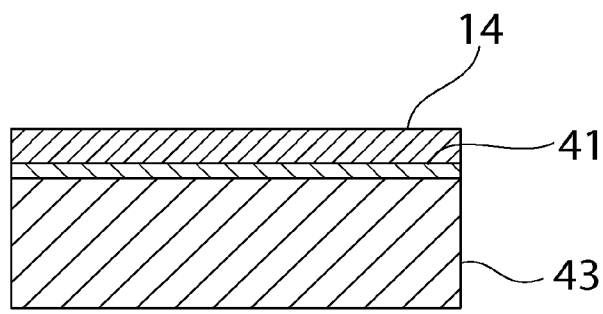
FIG. 5 is a schematic cross-sectional view for explaining a manufacturing process of a transmission surface acoustic wave filter chip according to a preferred embodiment of the present invention.

Subsequently, while heating the piezoelectric substrate 14A, on which the temporary support member 43 is laminated, to a temperature of about 250° C. to about 400° C., the piezoelectric substrate 14A is cut at the vicinity of a highly-concentrated ion implantation region 14a of the piezoelectric substrate 14A. As a result, the piezoelectric layer 14 is formed on the temporary support member 43, as shown in FIG. 5. By using such method, a thin piezoelectric layer 14 can be formed.

After the isolation, a surface of the piezoelectric layer 14 may be polished and flattened.

Figure 6:
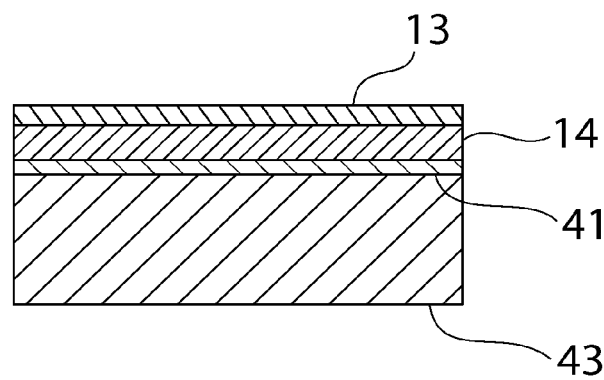
FIG. 6 is a schematic cross-sectional view for explaining a manufacturing process of a transmission surface acoustic wave filter chip according to a preferred embodiment of the present invention.
Figure 7:
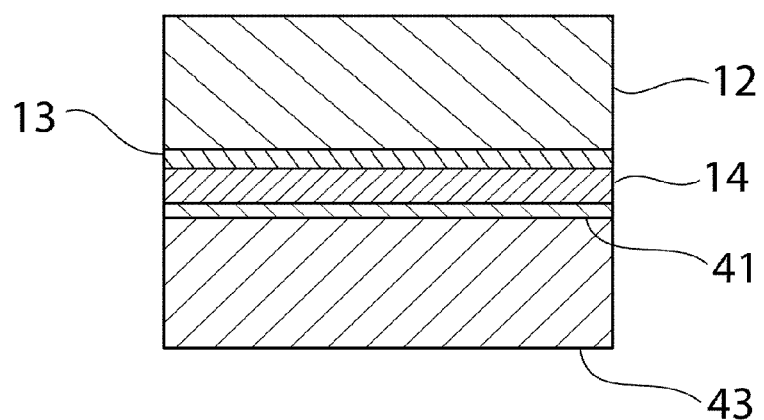
FIG. 7 is a schematic cross-sectional view for explaining a manufacturing process of a transmission surface acoustic wave filter chip according to a preferred embodiment of the present invention.

Next, as shown in FIG. 7, the support substrate 12 is directly or indirectly laminated and bonded on the surface of the piezoelectric layer 14 on the opposite side to the temporary support member 43. To be more specific, as shown in FIG. 6, the dielectric layer 13 is formed first on the piezoelectric layer 14 using a sputtering technique, a CVD technique, or the like. Thereafter, as shown in FIG. 7, the support substrate 12 is bonded to the upper side of the dielectric layer 13.

Figure 8:
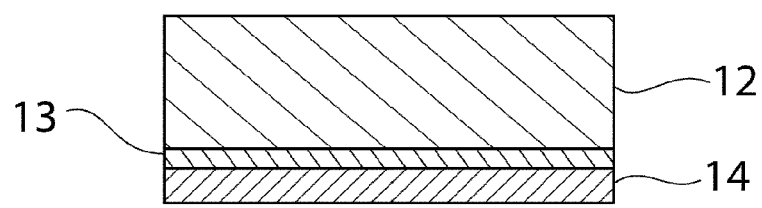
FIG. 8 is a schematic cross-sectional view for explaining a manufacturing process of a transmission surface acoustic wave filter chip according to a preferred embodiment of the present invention.

Subsequently, the etching layer 41 is removed using an etchant that is capable of dissolving the etching layer 41. As a result, a multilayer body in which the support substrate 12, the dielectric layer 13, and the piezoelectric layer 14 are laminated, as shown in FIG. 8, can be obtained. After this, by appropriately forming the IDT electrode 15 and so on, the transmission surface acoustic wave filter chip 11a can be completed.

Next, the transmission surface acoustic wave filter chip 11a and the reception surface acoustic wave filter chip 11b are facedown mounted on the mounting substrate 20.

Then, by pressing a resin film from the rear surfaces of the mounted elastic wave chips, a resin layer that encapsulates the chips while ensuring an IDT vibration space with the resin is formed. By shaving a surface of the formed resin layer on the opposite side to the mounting substrate 20, each of the rear surfaces of the elastic wave chips is exposed. Thereafter, by disposing the insulation plate 32, the surface acoustic wave filter device 1 is completed.

In the above preferred embodiment, although the surface acoustic wave filter device 1 is exemplified, the elastic wave filter device according to the present invention is not intended to be limited to the surface acoustic wave filter device. The elastic wave filter device according to the present invention may be a boundary acoustic wave filter device, for example.

Figure 9:
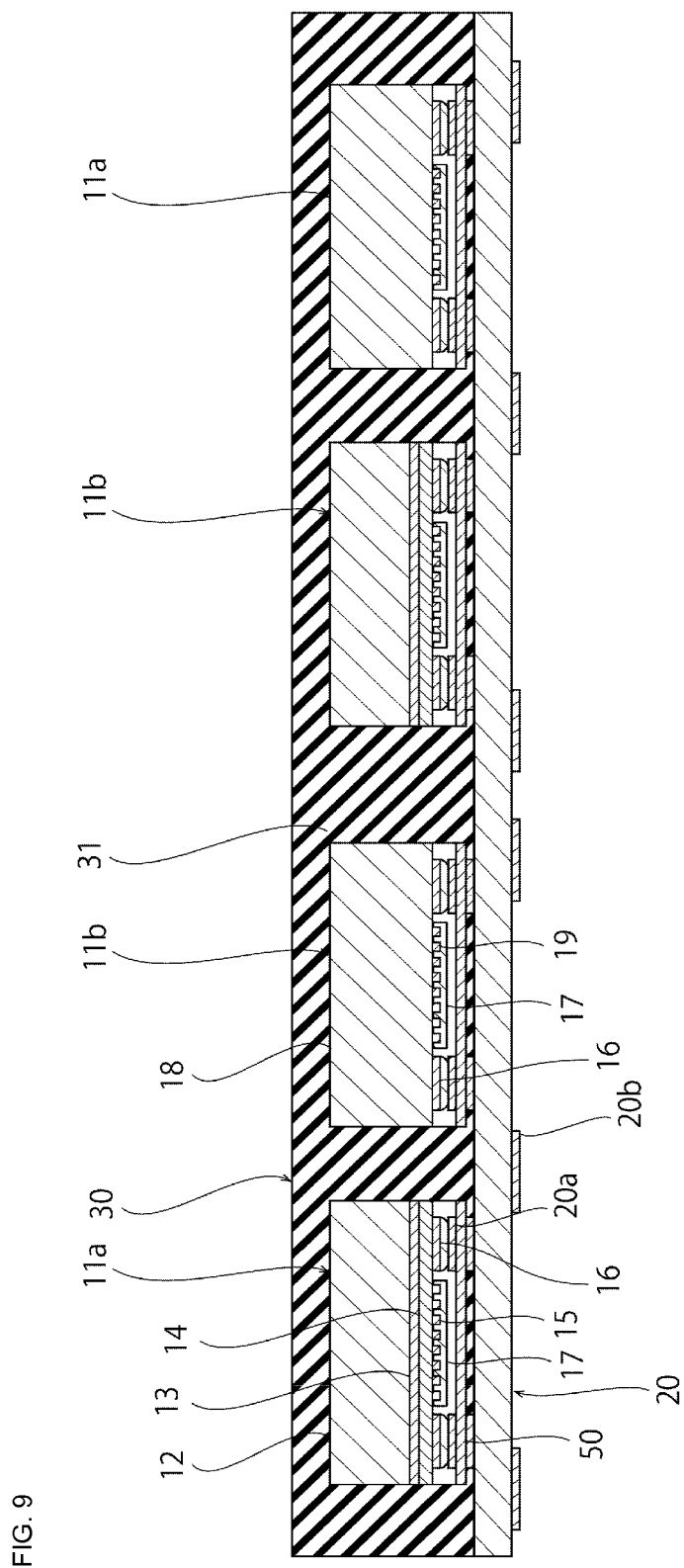
FIG. 9 is a schematic cross-sectional view illustrating a surface acoustic wave filter device according to a first variation of a preferred embodiment of the present invention.
Figure 10:
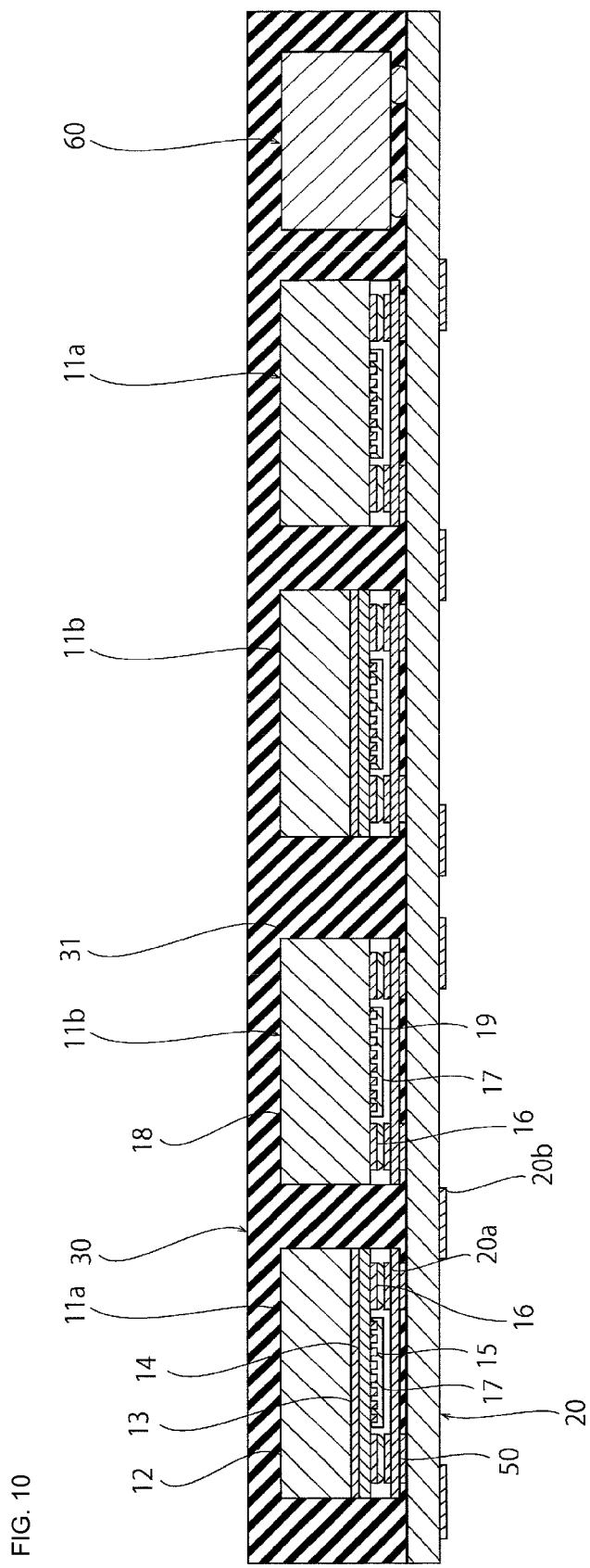
FIG. 10 is a schematic cross-sectional view illustrating a surface acoustic wave filter device according to a second variation of a preferred embodiment of the present invention.

In addition, as shown in FIG. 9, the elastic wave filter chips 11a and 11b may include a protection member 50 configured to ensure a space in which the IDT electrode 15 vibrates. In this case, a semiconductor substrate or the like may be used as the mounting substrate 20. In other words, the mounting substrate 20 may be configured with a semiconductor chip such as an RF switch or the like, and so on. The insulation member 30 may be configured with a single resin member. A plurality of the transmission surface acoustic wave filter chips 11a and a plurality of the reception surface acoustic wave filter chips 11b may be provided. Further, as shown in FIG. 10, in the elastic wave device, the surface acoustic wave filter chips 11a, 11b and a semiconductor chip 60 such as an RF switch, and the like, may be mounted on the same mounting substrate 20.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
an insulation plate;
a transmission elastic wave filter chip disposed on the insulation plate; and
a reception elastic wave filter chip disposed on the insulation plate; wherein
the transmission elastic wave filter chip includes:
a support substrate made of an insulating material and disposed on the insulation plate;
a piezoelectric layer directly or indirectly disposed on the support substrate; and
an IDT electrode disposed on the piezoelectric layer;
the reception elastic wave filter chip includes:
a piezoelectric substrate disposed on the insulation plate; and
an IDT electrode disposed on the piezoelectric substrate;
a thermal conductivity of the support substrate is higher than a thermal conductivity of either of the piezoelectric layer and the piezoelectric substrate; and
a thermal conductivity of the insulation plate is higher than the thermal conductivity of either of the piezoelectric layer and the piezoelectric substrate.

2. The elastic wave filter device according to claim 1, wherein the IDT electrode includes an epitaxial film mainly comprising aluminum.

3. The elastic wave filter device according to claim 1, further comprising:
a mounting substrate on which the transmission elastic wave filter chip and the reception elastic wave filter chip are facedown mounted.

4. The elastic wave filter device according to claim 3, wherein the support substrate is made of at least one type of material selected from a group of aluminum oxide, aluminum nitride, boron nitride, silicon carbide, silicon, and magnesium oxide.

5. The elastic wave filter device according to claim 3, wherein a thermal expansion coefficient of the support substrate is smaller than a thermal expansion coefficient of the piezoelectric layer.

6. The elastic wave filter device according to claim 5, wherein the support substrate is made of at least one type of material selected from a group of aluminum oxide, aluminum nitride, boron nitride, silicon carbide, silicon, and magnesium oxide.

7. The elastic wave filter device according to claim 3, further comprising:
a protection unit disposed on the mounting substrate, covers side surfaces of the support substrate and the piezoelectric layer and side surfaces of the piezoelectric substrate, and is configured to expose at least a portion of a surface of the support substrate on an opposite side to the mounting substrate and at least a portion of a surface of the piezoelectric substrate on an opposite side to the mounting substrate; wherein
the insulation plate extends across the surface of the support substrate exposed from the protection unit and the surface of the piezoelectric substrate exposed from the protection unit.

8. The elastic wave filter device according to claim 7, wherein the insulation plate is made of at least one type of material selected from a group of aluminum oxide, aluminum nitride, boron nitride, silicon carbide, magnesium oxide, and silicon.

9. The elastic wave filter device according to claim 1, wherein a thermal expansion coefficient of the support substrate is smaller than a thermal expansion coefficient of the piezoelectric layer.

10. The elastic wave filter device according to claim 9, wherein the support substrate is made of at least one type of material selected from a group of aluminum oxide, aluminum nitride, boron nitride, silicon carbide, silicon, and magnesium oxide.

11. The elastic wave filter device according to claim 1, wherein the support substrate is made of at least one type of material selected from a group of aluminum oxide, aluminum nitride, boron nitride, silicon carbide, silicon, and magnesium oxide.

12. The elastic wave filter device according to claim 1, wherein
the transmission elastic wave filter chip is a ladder-type elastic wave filter chip; and
the reception elastic wave filter chip is a longitudinally coupled resonator-type elastic wave filter chip.

13. A manufacturing method of the elastic wave filter device comprising the steps of:
disposing a transmission elastic wave filter chip on an insulation plate; and
disposing a reception elastic wave filter chip on the insulation plate; wherein the step of the disposing the transmission elastic wave filter chip includes the steps of:
  forming a support substrate made of an insulating material on the insulation plate;
  forming a piezoelectric layer directly or indirectly on the support substrate; and
  forming an IDT electrode on the piezoelectric layer;
the step of the disposing the reception elastic wave filter chip includes the steps of:
  forming a piezoelectric substrate on the insulation plate, and
  forming an IDT electrode on the piezoelectric substrate;
a thermal conductivity of the support substrate is higher than a thermal conductivity of either of the piezoelectric layer and the piezoelectric substrate, and
a thermal conductivity of the insulation plate is higher than the thermal conductivity of either of the piezoelectric layer and the piezoelectric substrate.

\* \* \* \* \*